United States Patent
Jung

(10) Patent No.: US 11,080,134 B2
(45) Date of Patent: Aug. 3, 2021

(54) MEMORY CONTROLLER AND MEMORY SYSTEM INCLUDING THE SAME

(71) Applicant: SK hynix Inc., Gyeonggi-do (KR)

(72) Inventor: Yong Il Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 126 days.

(21) Appl. No.: 16/227,876

(22) Filed: Dec. 20, 2018

(65) Prior Publication Data
US 2019/0377634 A1 Dec. 12, 2019

(30) Foreign Application Priority Data
Jun. 12, 2018 (KR) .................. 10-2018-0067742

(51) Int. Cl.
*G06F 11/10* (2006.01)
*H03M 13/45* (2006.01)
*G11C 29/52* (2006.01)

(52) U.S. Cl.
CPC .......... *G06F 11/1068* (2013.01); *G11C 29/52* (2013.01); *H03M 13/45* (2013.01)

(58) Field of Classification Search
None
See application file for complete search history.

(56) References Cited

U.S. PATENT DOCUMENTS

| | | | |
|---|---|---|---|
| 7,849,383 B2 | 12/2010 | Lin | |
| 8,046,527 B2 | 10/2011 | Pyeon et al. | |
| 9,390,002 B1* | 7/2016 | Lee | G06F 12/0207 |
| 2014/0169092 A1* | 6/2014 | Miyamoto | G11C 16/24 |
| | | | 365/185.09 |
| 2015/0169468 A1* | 6/2015 | Camp | G11C 11/56 |
| | | | 711/207 |
| 2017/0139769 A1* | 5/2017 | Blaichman | G11C 29/52 |

* cited by examiner

*Primary Examiner* — Cynthia Britt
*Assistant Examiner* — Matthew W Wahlin
(74) *Attorney, Agent, or Firm* — IP & T Group LLP

(57) ABSTRACT

There are provided a memory controller and a memory system including the same. The memory controller includes: a processor for generating a command and an address in response to a request from a host, and generating a bin label and a Log Likelihood Ratio (LLR), based on data received from memory devices; a buffer memory for temporarily storing the data, the bin label, and the LLR; and an error correction circuit for performing error correction decoding on the data, using the LLR.

19 Claims, 12 Drawing Sheets

MEMORY CONTROLLER AND MEMORY SYSTEM INCLUDING THE SAME

CROSS-REFERENCE TO RELATED APPLICATION

The present application claims priority under 35 U.S.C. § 119(a) to Korean patent application number 10-2018-0067742, filed on Jun. 12, 2018, which is incorporated herein by reference in its entirety.

BACKGROUND

1. Field of Invention

Various embodiments of the present disclosure generally relate to a memory controller and a memory system including the same. Particularly, the embodiments to a memory controller for performing an error correction operation and a memory system including the same.

2. Description of Related Art

A memory system may include a memory device for storing data and a memory controller for controlling the memory device in response to a request from a host.

The memory device may be a volatile memory device in which stored data is lost when the power supply is interrupted or a nonvolatile memory device in which stored data is retained even when the power supply is interrupted.

The nonvolatile memory device may perform a program operation of storing data in a memory cell, a read operation of reading data stored in a memory cell, and an erase operation of erasing stored data under the control of the memory controller. In the memory device, an error correction encoding may be performed on programmed data, and an error correction decoding may be performed on read data.

SUMMARY

Embodiments provide a memory controller capable of rapidly performing error correction decoding on a plurality of memory devices and a memory system including the memory controller.

According to an aspect of the present disclosure, there is provided a memory controller including: a processor configured to generate a command and an address in response to a request from a host, and generate a bin label and a Log Likelihood Ratio (LLR), based on data received from memory devices; a buffer memory configured to temporarily store the data, the bin label, and the LLR; and an error correction circuit configured to perform error correction decoding on the data using the LLR, wherein the processor: when a result of error correction decoding on data read in a first memory device among the memory devices is determined to have failed, temporarily stores a first bin label of the first memory device in at least one page buffer of the first memory device and then performs error correction decoding for a second memory device; when a result of error correction decoding on data read in the second memory device among the memory devices is determined to have failed, temporarily stores a second bin label used in the error correction decoding of the second memory device in at least one page buffer of the second memory device; and receives the first bin label temporarily stored in the first memory device to perform error correction decoding on data read in the first memory device using another read voltage.

According to another aspect of the present disclosure, there is provided a memory system including: a first memory device and a second memory device, each of which is configured to store data; and a memory controller configured to control a read operation of each of the first and second memory devices, wherein the memory controller: generates a bin label and an LLR based on first data received from the first memory device; performs error correction decoding on the first data using the LLR; when the error correction decoding fails, transmits the bin label to the first memory device; and receives second data from the second memory device, and performs error correction decoding on the second data.

According to another aspect of the present disclosure, there is provided a memory system including: first and second memory devices, each including a memory cell array and at least one page buffer; and a controller configured to: control each the first and second memory devices to repeat an operation of sensing data from the corresponding memory cell arrays and outputting the sensed data to the at least one page buffer, using a different read voltage for each sensing operation, until an error-correction operation is successful; generate a bin label based on the sensed data; repeat the error-correction operation to the sensed data until the error-correction operation is successful; control, during the repeated error-correction operations, each of the first and second memory devices to update the bin label in the at least one page buffer at each failure of the error-correction operation for use at each subsequent error-correction operation, wherein the first and second memory devices share a channel and alternately communicate with the controller through the channel.

BRIEF DESCRIPTION OF THE DRAWINGS

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. It is noted that, throughout the specification, reference to "an embodiment," "another embodiment," or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the present disclosure, advantages, features and methods for achieving them will become more apparent in light of the embodiments described below in conjunction with the drawings. Features of the present disclosure may, however, be embodied differently than disclosed herein. Thus, the disclosed embodiments are not intended to be limiting. Rather, these embodiments are provided to enable those skilled in the art to which the disclosure pertains to practice the present invention.

In the entire specification, when an element is referred to as being "connected" or "coupled" to another element, it can be directly connected or coupled to the another element or be indirectly connected or coupled to the another element with one or more intervening elements interposed. In addition, when an element is referred to as "including" a component, this indicates that the element may further include one or more other components instead of excluding such other component(s), unless the context indicates otherwise.

The terminology used herein is for the purpose of describing particular embodiments only and is not intended to be limiting of the present invention.

As used herein, singular forms may include the plural forms as well and vice versa, unless the context clearly indicates otherwise.

Hereinafter, the various embodiments of the present invention will be described in detail with reference to the attached drawings.

Figure 1:
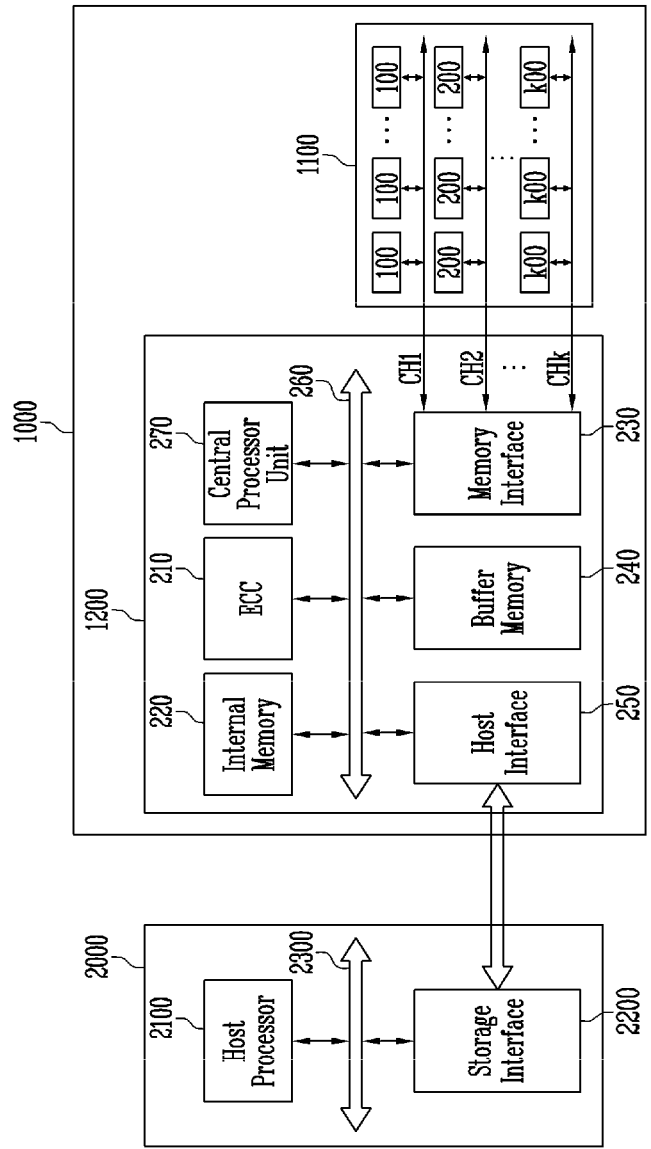
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a storage device 1100 for storing data and a memory controller 1200 for communicating between the storage device 1100 and a host 2000.

The storage device 1100 may include a plurality of memory devices 100, 200, . . . , and k00. For example, the memory devices 100, 200, . . . , and k00 may be implemented as a volatile memory device in which stored data disappears when the supply of power is interrupted or a nonvolatile memory device in which store data is retained even when the supply of power is interrupted. FIG. 1 illustrates an embodiment in which the memory devices 100, 200, . . . , and k00 are implemented with the nonvolatile memory device. For example, the nonvolatile memory device may be a flash memory device.

The memory devices 100, 200, . . . , and k00 may be coupled to a plurality of channels CH1 to CHk. For example, the plurality of memory devices 100, 200, . . . , and k00 may be coupled to the first to kth channels CH1 to CHk, respectively. For example, memory devices 100 may be coupled to the first channel CH1, memory devices 200 may be coupled to the second channel CH2, and memory devices k00 may be coupled to the kth channel CHk.

The memory controller 1200 may include a processor such as a central processing unit (CPU) 200, an error correction circuit (ECC) 210, an internal memory 220, a memory interface 230, a buffer memory 240, and a host interface 250.

The CPU 270 may perform various calculations for controlling the storage device 1100, or generate a command and an address. For example, the CPU 270 may generate a command in response to a request from the host 2000. The CPU 270 may search for a Log Likelihood Ratio (LLR) value in an LLR table, based on a bin label for error correction decoding. The LLR table may be a table that stores LLRs selectable according to various bin labels. The LLR table may be stored in the CPU 270 or the buffer memory 240. Also, the CPU 270 may generate a command for a subsequent operation, based on an error correction decoding result of the ECC 210.

The ECC 210 may encode data received from the host in a program operation. The ECC 210 may decode data received from any of the memory devices 100, 200, . . . , k00 in a read operation. For example, in a read operation, the ECC 210 may select an LLR, based on data received from a memory device and a bin label, perform error correction decoding on the data according to a selected LLR, and transmit an error correction decoding result to the CPU. When the error correction decoding result is determined as Pass, the read operation of the memory device of which error correction decoding has passed may be ended. For example, when it is determined that an error of the data received from the memory device can be corrected, the ECC 210 may output the error correction decoding result as Pass. When the error correction decoding result is determined as Fail, the read operation of the memory device of which error correction decoding has failed may be re-performed. For example, when it is determined that an error of the data received from the memory device cannot be corrected, the ECC 210 may output the error correction decoding result may be output as Fail. Whenever the read operation is re-performed since the error correction decoding fails, the bin label and the LLR may be changed.

The internal memory 220 may store various information necessary for an operation of the memory controller 1200. For example, the internal memory 220 may include logical and physical address map tables. The address map tables may be stored in the memory devices 100, 200, . . . , and k00. When the memory system 1000 is booted, the address map tables stored in the memory devices 100, 200, . . . , and k00 may be re-loaded to the internal memory 220. The internal memory 220 may be configured with at least one of a Random Access Memory (RAM), a Dynamic RAM (DRAM), a Static RAM (SRAM), a cache, and a Tightly Coupled Memory (TCM).

The memory interface 230 may exchange commands, addresses, data, and the like between the memory controller 1200 and the storage device 1100. For example, the memory interface 230 may transmit commands, addresses, data, bin labels, and the like to the memory device 100, 200, . . . , and k00 through the first to kth channels CH1 to CHk, and receive data, bin labels, and the like from the memory devices 100, 200, . . . , and k00.

When an operation of the memory system 1000 is performed, the buffer memory 240 may temporarily store data necessary for the operation. For example, in a program operation, the buffer memory 240 may temporarily store original program data until the program operation of a selected memory device 100 passes. In a read operation, the buffer memory 240 may temporarily store data read from the memory device 100 and a bin label, and temporarily store an LLR selected based on the bin label. The buffer memory 240 may transmit the temporarily stored data, bin label, and LLR to the ECC 210. Also, the buffer memory 240 may store address mapping information necessary for the operation of the memory system 1000, and frequently update the address mapping information.

The host interface 250 may exchange commands, addresses, data, and the like between the memory controller 1200 and the host 2000. For example, the host interface 250 may receive a request, an address, data, and the like from the host 2000, and transmit data and the like to the host 2000. The CPU 270, the host processor 210, the internal memory 220, the memory interface 230, the buffer memory 240, and the host interface 250 may communicate with each other through a bus 260.

The host 2000 may include a host processor 2100 and a storage interface 2200. The host processor 2100 and the storage interface 2200 may communicate with each other through a bus 2300.

The host processor 2100 may generate a program request for controlling the program operation of the memory system 1000 or a read request for controlling the read operation of the memory system 1000.

The storage interface 2200 may communicate with the memory system 1000 by using an interface protocol such as a Peripheral Component Interconnect express (PCIe), an Advanced Technology Attachment (ATA), a Serial ATA (SATA), a Parallel ATA (PATA), a Serial Attached SCSI (SAS) or a Non-Volatile Memory express (NVMe). Communication of the storage interface 2200 is not limited to the above-described examples, and may instead be implemented using any of various other interfaces such as a Universal Serial Bus (USB), a Multi-Media Card (MMC), an Enhanced Small Disk Interface (ESDI), and an Integrated Drive Electronics (IDE).

Figure 2:
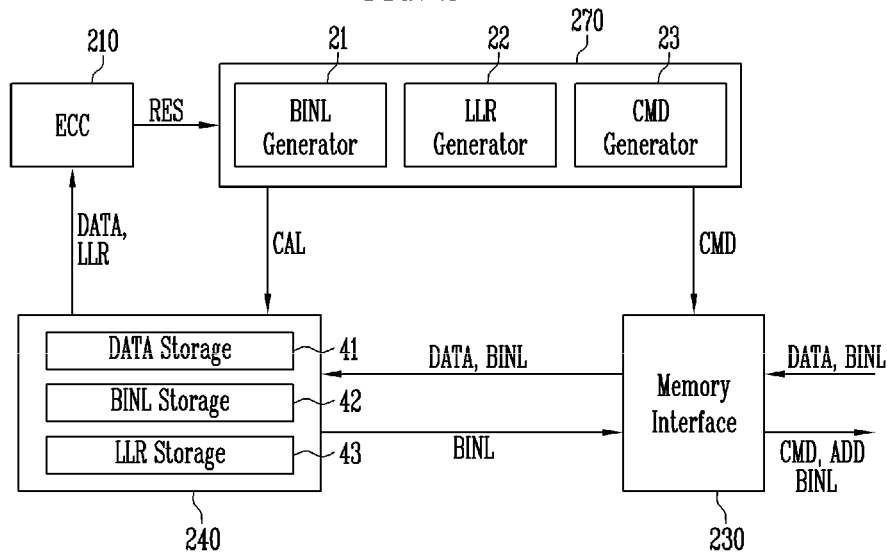
FIG. 2 is a diagram illustrating in detail a central processing unit (CPU), an error correction circuit, and a buffer memory, which are shown in FIG. 1.

FIG. 2 is a diagram illustrating in detail the CPU 270, the ECC 210, and the buffer memory 240, which are shown in FIG. 1.

Referring to FIG. 2, in this embodiment, an error correction operation may be performed in a soft decoding scheme. To this end, the memory controller may include the CPU 270, the ECC 210, and the buffer memory 240.

The CPU 270 may generate a command CMD, based on a request received from the host 2000 or an error correction decoding result RES of the ECC 210. Also, the CPU 270 may receive a bin label BINL for the error correction operation, select an LLR, based on the received bin label BINL, and transmit a calculation value CAL including the bin label BINL and the LLR to the buffer memory 240. The ECC 210 may perform error correction decoding according to data DATA and the LLR, which are received from the buffer memory 240, and output an error correction decoding result RES to the CPU 270. The buffer memory 240 may temporarily store data DATA, a bin label BINL, and an LLR. The memory interface 230 may transmit a command CMD received from the CPU 270 to a memory device. The memory interface 230 may receive data DATA and a bin label BINL from the memory device, and transmit the data DATA and the bin label BINL to the buffer memory 240.

The CPU 270, the ECC 210, and the buffer memory 240 will be described in more detail as follows.

The CPU 270 may include a bin label (BINL) generator 21, an LLR generator 22, and a command (CMD) generator 23.

The BINL generator 21 may generate, as a bin label BINL, a value obtained by adding all code words of read data DATA. A code word means read data. For example, when a read operation is performed using a first read voltage, read data of a memory cell having a threshold voltage lower than the first read voltage may be output as 0, and read data of a memory cell having a threshold voltage higher than the first read voltage may be output as 1. When read operations are performed using ten read voltages, ten single-bit code words may be generated, and a value obtained from the combined ten-bit code word may be generated as a bin label BINL. For example, when the ten-bit code word is 0000111111, the bin label BINL may be generated as 6. When the ten-bit code word is 0000000011, the bin label BINL may be generated as 2.

The LLR generator 22 may store an LLR table used in error correction decoding, and select and output an LLR, based on a bin label. The LLR may be used when an error is corrected using a Low Density Parity Check (LDPC) code. The LLR is a value obtained by taking a log on a ratio of the likelihood that data stored in memory cells will be "1" to the likelihood that the data stored in the memory cells will be "0". For example, the LLR may be calculated by Equation 1.

$$LLR = \log(N2/N1) \quad \quad \text{Equation 1}$$

Referring to Equation 1, N1 may be the likelihood that data of memory cells will be 1, and N2 may be the likelihood that the data of the memory cells will be 0. Alternatively, N1 may be a number of memory cells of which read data is 1, and N2 may be a number of memory cells of which read data is 0. The LLR may be represented as likelihood with respect to a bin label, and be used in error correction decoding using the LDPC. Therefore, when the bin label is changed, the LLR may also be changed.

The LLR selected by the LLR generator 22 and the bin label BINL generated by the BINL generator 21 may be transmitted as calculation values CAL to the buffer memory 240.

The CMD generator 23 may generate a command CMD in response to a request received from the host 2000, or generate a command CMD, based on an error correction decoding result RES transmitted from the ECC 210. For example, when the error correction decoding result RES is determined as Pass, the CMD generator 23 may end a read operation of a memory device of which error correction decoding has passed. When the error correction decoding result RES is determined as Fail, the CMD generator 23 may re-perform a read operation of a memory device of which error correction decoding has failed.

The ECC 210 may perform error correction decoding on data DATA, using the LLR, and output an error correction decoding result RES. The error correction decoding result RES may include a pass signal or a fail signal, based on a result obtained by performing the error correction decoding.

The buffer memory 240 may include a data (DATA) storage 41, a BINL storage 42, and an LLR storage 43.

The DATA storage 41 may temporarily store data DATA read from a memory device, and transmit the temporarily stored data to the ECC 210. The data DATA read from the memory device may be transmitted to the memory buffer 240 through the memory interface 230.

The BINL storage 42 may temporarily store a bin label BINL included in a calculation value CAL, and re-transmit the bin label BINL to the memory device through the memory interface 230.

The LLR storage 43 may temporarily store an LLR included in a calculation value CAL, and transmit the temporarily stored LLR to the ECC 210.

The buffer memory 240 may include storages for storing various data or information, in addition to the above-described storages. In this embodiment, when a read operation is performed on more than one of the memory devices 100, 200, . . . , and k00, a bin label BINL for error correction decoding is backed up to page buffers of the memory devices, so that a storage space for temporarily storing the bin label BINL in the buffer memory 240 can be reduced. For example, bin labels BINL with respect to a plurality of memory devices are to be all stored in the buffer memory 240 so as to perform error correction decoding on the memory devices. However, the storage space of the buffer memory 240 may be insufficient or unavailable. Therefore, in this embodiment, all bin labels BINL are not stored in the buffer memory 240 but backed up to a selected memory device in an error correction operation, and may be used in a next error correction operation of the selected memory device. Accordingly, the storage space of the buffer memory 240 can be ensured, and thus an error correction decoding operation can be performed on a plurality of memory devices without increasing the capacity of the buffer memory 240. In addition, a sensing operation and an error correction decoding operation of a plurality of memory devices are performed in parallel, so that the error correction decoding operation of the plurality of memory devices can be rapidly performed. When the capacity of a bin label BINL increases since an error correction decoding operation in a read operation on a selected page of a selected memory block of a selected plane in a selected memory device repeatedly fails, the bin label BINL may be temporarily stored in page buffers coupled to another plane included in the selected memory device. A method related to the error correction decoding operation on a plurality of memory devices is described in detail below.

Figure 3:
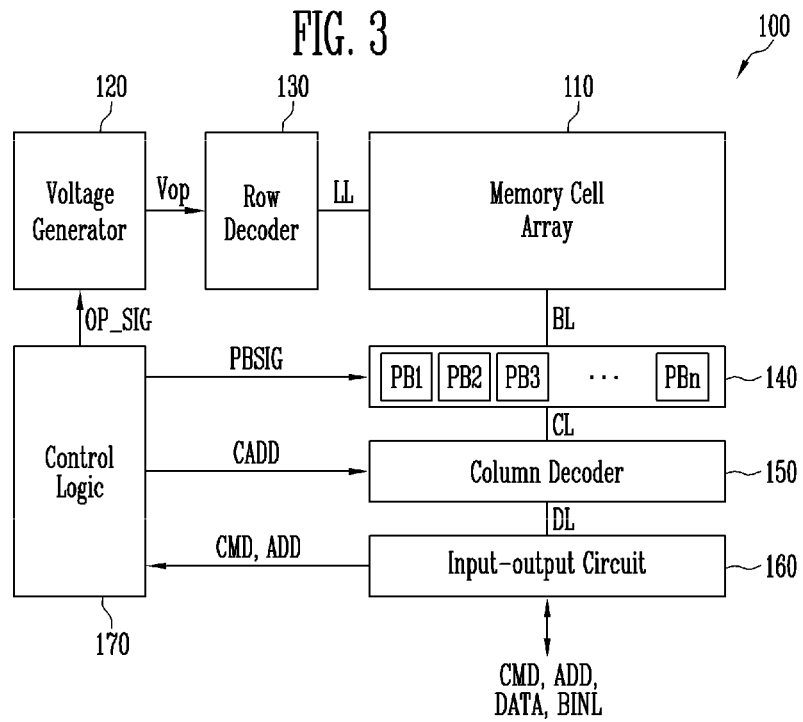
FIG. 3 is a diagram illustrating in detail a memory device of FIG. 1.

FIG. 3 is a diagram illustrating in detail an exemplary memory device of FIG. 1. The memory devices 100, 200, . . . , and k00 of FIG. 1 are configured identically to one another, and therefore, any one memory device 100, among the memory devices 100, 200, . . . , and k00, will be described as an example.

Referring to FIG. 3, the memory device 100 may include a memory cell array 110, a voltage generator 120, a row decoder 130, a page buffer group 140, a column decoder 150, an input-output circuit 160, and a control logic 170.

The memory cell array 110 may include a plurality of memory cells for storing data. The memory cells may be divided into a plurality of memory blocks, and the memory blocks may be divided into a plurality of planes.

The voltage generator 120 may generate and output operation voltages Vop necessary for each operation in response to an operation signal OP_SIG. For example, the voltage generator 120 may generate a program voltage, a pass voltage, a program verify operation, and the like in a program operation, generate a read voltage, a pass voltage, and the like in a read operation, and generate an erase voltage, an erase verify voltage, a pass voltage, and the like in an erase operation.

The row decoder 130 may transfer an operation voltage Vop to local lines LL coupled to a selected memory block.

The page buffer group 140 may include a plurality of page buffers PB1 to PBn (n is a positive integer) coupled to the memory blocks through bit lines BL. The page buffers PB1 to PBn may sense voltages or currents of the memory cells through the bit lines in response to a page signal PBSIG, and temporarily store the sensed data. The page buffers PB1 to PBn may exchange data with the column decoder 150 through column lines CL. Also, the page buffers PB1 to PBn may temporarily store a bin label BINL received from the memory controller 120, and again output the temporarily stored bin label BINL to the memory controller 1200. For example, each of the page buffers PB1 to PBn may include a plurality of latches, and the bin label BINL may be temporarily stored in an idle latch among the plurality of latches.

The column decoder 150 may exchange data with the input-output circuit 160 through data lines DL, and exchange data with the page buffer group 140 through the column lines CL. The column decoder 150 may transmit/receive data in response to a column address CADD.

The input-output circuit 160 may receive a command CMD, an address ADD, data DATA, and a bin label BINL from the memory controller 1200, transmit the command CMD and the address ADD to the control logic 170, and transmit the data DATA or the bin label BINL to the column decoder 150. The input-output circuit 160 may receive data DATA or a bin label BINL from the column decoder 150, and transmit the data DATA or the bin label BINL to the memory controller 1200.

The control logic 170 may control the voltage generator 120, the row decoder 130, the page buffer group 140, the column decoder 150, and the input-output circuit 160 such that a program, read or erase operation is performed in response to the command CMD and the address ADD. For example, the control logic 170 may output the operation signal OP_SIG, the page signal PBSIG, and the column address CADD in response to the command CMD and the address ADD.

Figure 4:
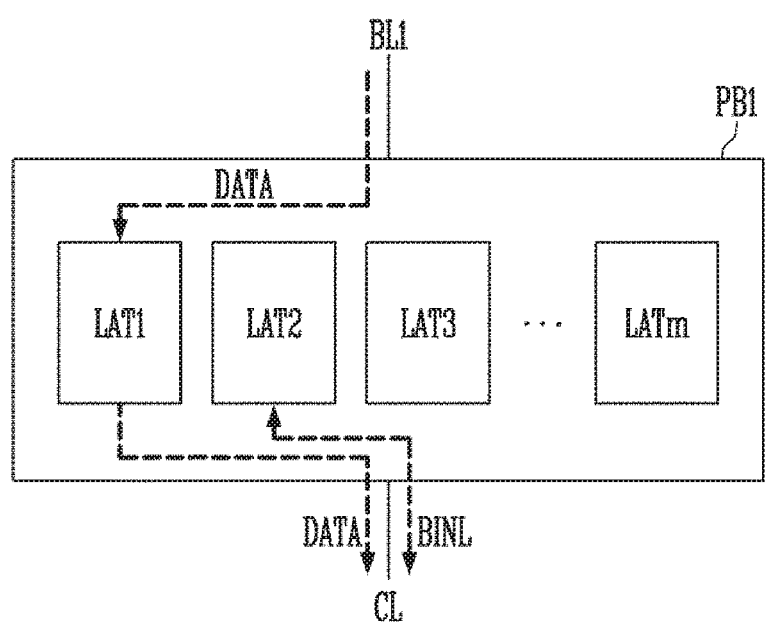
FIG. 4 is a diagram illustrating in detail a page buffer of FIG. 3.

FIG. 4 is a diagram illustrating in detail a page buffer of FIG. 3. The page buffers PB1 to PBn are configured identically to one another, and therefore, any one page buffer PB1 will be described as an example.

Referring to FIG. 4, the page buffer PB1 may include first to mth latches LAT1 to LATm (m is a positive integer). Although not shown in the drawing, a plurality of switches are also included in the page buffer PB1, in addition to the latches LAT1 to LATm.

In the page buffer PB1, the first to mth latches LAT1 to LATm may temporarily store data or a bin label BINL. For example, the first latch LAT1 may temporarily store data DATA received through a first bit line BL1, and output the stored data DATA through a column line CL. The second latch LAT2 may temporarily store a bin label BINL received through the column line CL, and output the stored bin label BINL through the column line CL. That is, some latches, among all latches LAT1 to LATm, may be used in a sensing operation, and other latches may be used to temporarily store the bin label BINL in a read operation.

Figure 5:
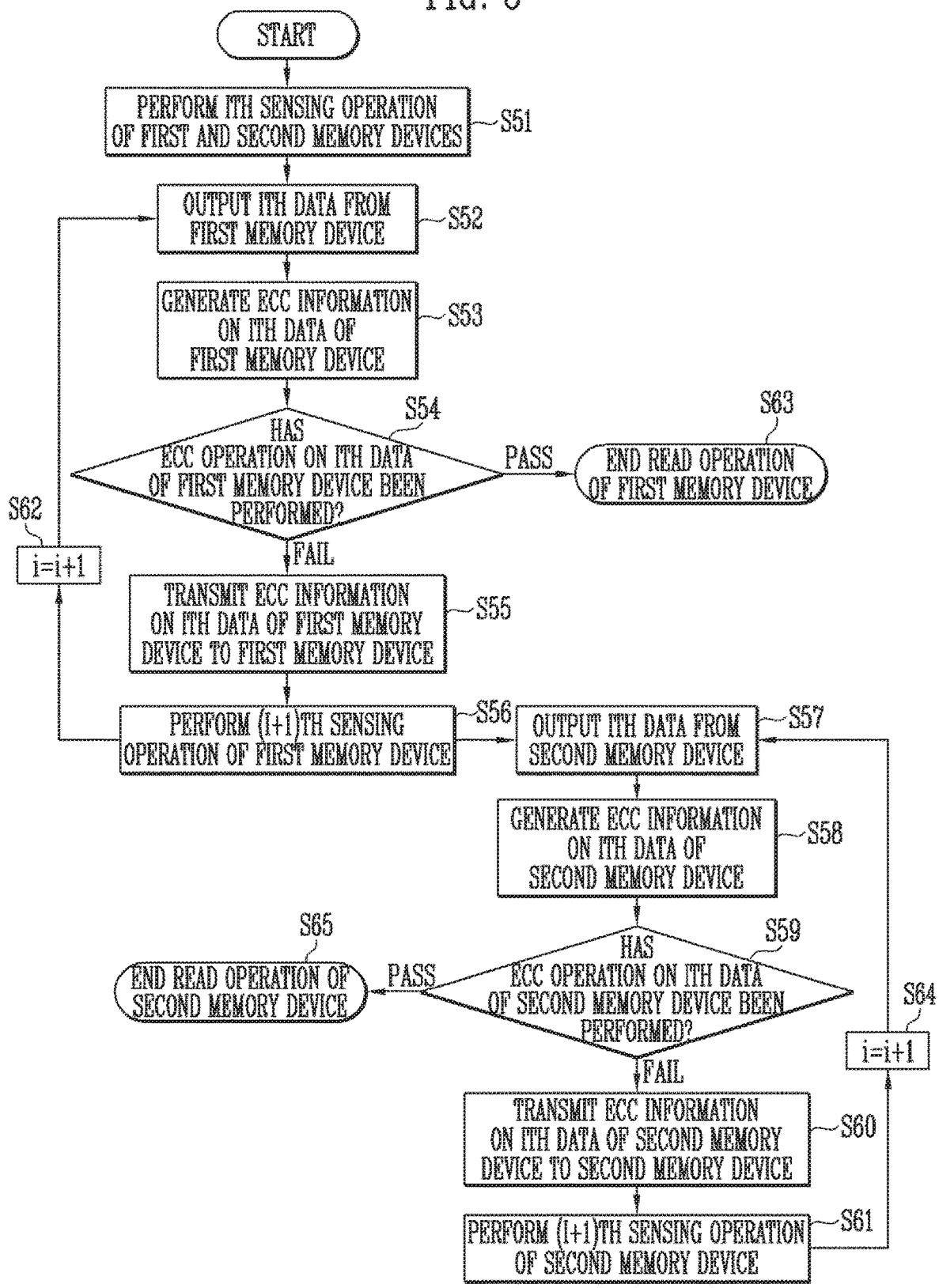
FIG. 5 is a flowchart illustrating a read operation according to an embodiment of the present disclosure.

FIG. 5 is a flowchart illustrating a read operation according to an embodiment of the present disclosure.

Referring to FIG. 5, a read operation may be performed on a plurality of memory devices. For example, when memory blocks of different memory devices operate as one super block, a read operation may be performed on the memory devices. The super block may be a logical concept for allowing a plurality of physical memory blocks to operate as one block. For example, a first memory block of a first memory device and a first memory block of a second memory device may be managed as one super block. The first memory blocks respectively included in the first and second memory devices may operate at the same time. However, since the first and second memory devices are commonly coupled to one channel, operations of transferring command, address, and data through the single channel, may be individually performed while operations performed within the first and second memory devices may be simultaneously performed.

In FIG. 5, a read operation on two memory devices, e.g., first and second memory devices, will be described as an example.

When the read operation is started, an ith sensing operation ('i' is a positive integer) of the first and second memory devices may be simultaneously performed at step S51. In detail, the memory controller may sequentially transmit a read command and an address to each of the first memory device and the second memory device. The first and second memory devices may perform the ith sensing operation in response to the received read command and address. When the sensing operation is first performed, the value 'i' may be 1. That is, a first sensing operation may be simultaneously performed within the first and second memory devices.

Since the first and second memory devices are coupled to the same channel, sensed ith data cannot be simultaneously output from the first and second memory devices even when the ith sensing operation is ended in the first and second memory devices. Therefore, data may be first output from one of the first and second memory devices at step S52. The situation in which the ith data is first output from the first memory device is described here, but the sequence in which the memory devices output the ith data may be changed depending on the memory system.

The memory controller may generate error correction code (ECC) information on the ith data output from the first memory device at step S53. For example, the ECC information may include a bin label BINL and an LLR with respect to the ith data of the first memory device. When the read operation is repeatedly performed, the bin label BINL may be updated in a manner that a new incremented value derived from a previous value. The new value may represent accumulated previous values. Therefore, whenever the read operation is repeated, the capacity of the bin label BINL may increase. The ith data and the bin label BINL, which are output from the first memory device, may be temporarily stored in the buffer memory of the memory controller, and the memory controller may search for the LLR in the LLR table, based on the bin label BINL. The buffer memory may be a storage device coupled to the outside of the memory controller.

The ECC of the memory controller may perform an ECC operation on the ith data of the first memory device, using the LLR with respect to the ith data of the first memory device and ith data at step S54. For example, the ECC operation may be an error correction decoding operation on the ith data. When a result of the ECC operation is determined as Fail, the memory controller may transmit ECC information used in the ECC operation of the first memory device to the first memory device so as to ensure a storage area of the buffer memory at step S55. For example, a bin label BINL may be included in the ECC information transmitted to the first memory device, and an LLR selected by the bin label BINL may be transmitted together with the ECC information.

After the ECC information on the first memory device is transmitted to the first memory device, the area in which the bin label BINL and the LLR have been stored in the buffer memory may become a free area. That is, the bin label temporarily stored in the buffer memory is backed up to the first memory device, and hence the area in which the bin label has been stored in the buffer memory may become a free area. Therefore, registers in which the bin label BINL is temporarily stored in the buffer memory may be reset. The ECC information output from the buffer memory may be temporarily stored in page buffers of the first memory device. In more detail, the bin label BINL may be stored in idle latches included in each of the page buffers of the first memory device. For example, when the ECC information on the ith data of the first memory device is backed up to the first memory device, the area in which the ECC information has been temporarily stored in the buffer memory may be initialized. That is, the bin label temporarily stored in the buffer memory may be deleted, or both of the bin label BINL and the LLR stored in the buffer memory may be deleted.

The first memory device may perform an (i+1)th sensing operation by changing a first read voltage used in the ith sensing operation to a second read voltage at step S56.

When the first memory device performs the (i+1)th sensing operation at step S56, the second memory device may output the ith data of the second memory device, which is sensed in step S51, to the memory controller at step S57. That is, the (i+1)th sensing operation at step S56 of the first memory device and the ith data output operation at step S57 of the second memory device may be simultaneously performed.

The memory controller may generate ECC information on the ith data output from the second memory device at step S58. For example, the ECC information may include a bin label BINL and an LLR with respect to the ith data of the second memory device. When the read operation is repeatedly performed, the bin label BINL may be updated in a manner that accumulates a new value from a previous value. The ith data and the bin label BINL, which are output from the second memory device, may be temporarily stored in the buffer memory of the memory controller, and the memory controller may search for the LLR in the LLR table, based on the bin label BINL. The buffer memory may be a storage device coupled to the outside of the memory controller.

The ECC of the memory controller may perform an ECC operation on the ith data of the second memory device, using the LLR with respect to the ith data of the second memory device and ith data at step S59. For example, the ECC operation may be an error correction decoding operation on the ith data. When a result of the ECC operation is determined as Fail, the memory controller may transmit ECC information used in the ECC operation of the second memory device to the second memory device so as to ensure a storage area of the buffer memory at step S60. For example, a bin label BINL may be included in the ECC information transmitted to the second memory device, and an LLR selected by the bin label BINL may be transmitted together with the ECC information.

After the ECC information on the second memory device is transmitted to the second memory device, the area in the bin label BINL and the LLR have been stored in the buffer memory may become a free area. That is, the bin label temporarily stored in the buffer memory is backed up to the second memory device, and hence the area in which the bin label has been stored in the buffer memory may become a free area. Therefore, registers in which the bin label BINL is temporarily stored in the buffer memory may be reset. The ECC information output from the buffer memory may be temporarily stored in page buffers of the second memory device. In more detail, the bin label BINL may be stored in idle latches included in each of the page buffers of the second memory device. For example, when the ECC information on the ith data of the second memory device is backed up to the second memory device, the area in which the ECC information has been temporarily stored in the buffer memory may be initialized. That is, the bin label temporarily stored in the buffer memory may be deleted, or both of the bin label BINL and the LLR stored in the buffer memory may be deleted.

The second memory device may perform an (i+1)th sensing operation by changing a first read voltage used in the ith sensing operation to a second read voltage at step S61. The first and second read voltages may be different from the first and second read voltages used in the first memory device.

When the second sensing operation of the first memory device is ended in step S56, the value of i increases (i.e., i=i+1) at step S62, and thus becomes 2. The steps may be re-performed from step S52), i.e., of outputting second data sensed in the first memory device. In this manner, the steps S52 to S56 and S62 may be repeated. When the result of the ECC operation on the ith data of the first memory device is determined as Pass in step S54, the read operation of the first memory device may end at step S63.

When the second sensing operation of the second memory device ends at step S61, the value of i increases (i.e., i=i+1) at step S64, and thus becomes 2. The steps may be re-performed from step S57, i.e., of outputting second data sensed in the second memory device. In this manner, steps S57 to S61 and S64 may be repeated in the second memory device. When the result of the ECC operation on the ith data of the second memory device is determined as Pass in step S59, the read operation of the second memory device may end at step S65.

In FIG. 5, some operations among the read operation, the sensing operation, and the error correction decoding operation of the first and second memory devices can be performed in parallel, and thus the time required to perform the read operation can be reduced. This will be described with reference to FIG. 6.

Figure 6:
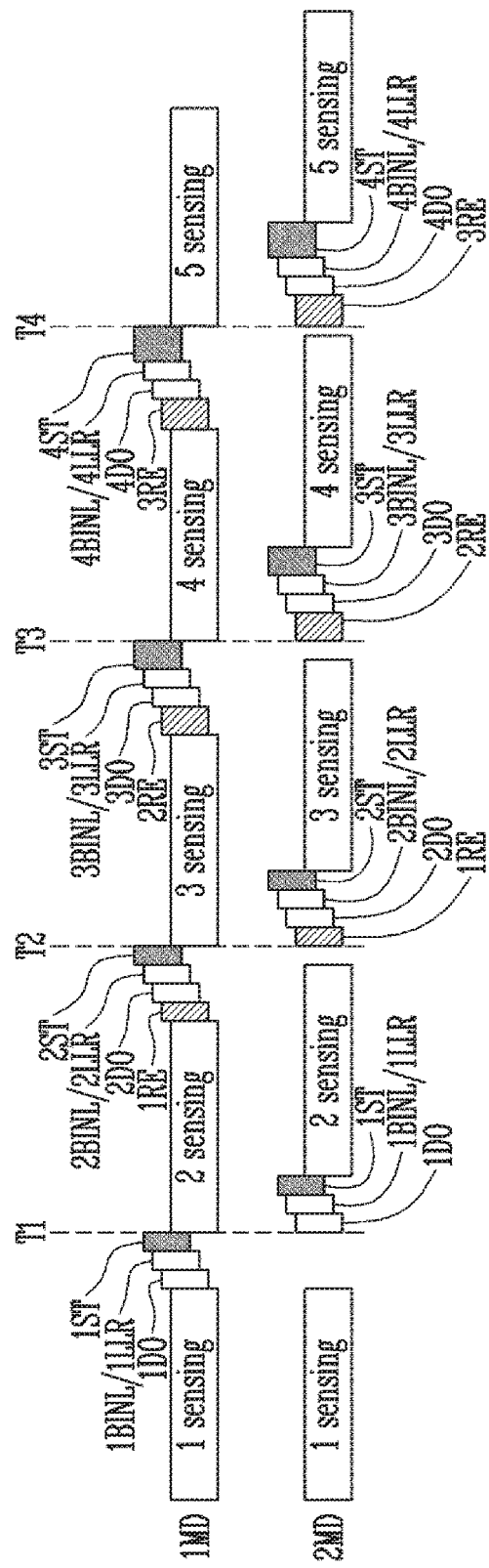
FIG. 6 is a diagram illustrating a read operation according to an embodiment of the present disclosure.

FIG. 6 is a diagram illustrating an embodiment of the read operation of the present disclosure.

Referring to FIG. 6, first and second memory devices 1MD and 2MD may simultaneously perform a first sensing operation (1 sensing). The first and second memory devices 1MD and 2MD may share a channel with each other.

When the first sensing operation (1 sensing) of each of the first and second memory devices 1MD and 2MD ends, first data sensed in the first memory device 1MD may be output to the memory controller 1DO.

The memory controller may generate first LLR (1LLR), based on a first bin label (1BINL) with respect to the first data received from the first memory device 1MD, and perform error correction decoding on the first data, using the first LLR (1LLR). When the error correction decoding on the first data of the first memory device 1MD fails, the memory controller may transmit the first bin label (1BINL) to the first memory device 1MD, and the first memory device 1MD may temporarily store the first bin label (1BINL) in idle latches of page buffers 1ST. The memory controller may transmit the first LLR (1LLR) together with the first bin label (1BINL) to the first memory device 1MD. Subsequently, the first memory device 1MD may perform a second sensing operation (2 sensing) by changing a read voltage.

When the second sensing operation (2 sensing) is performed in the first memory device 1MD (T1), the second memory device 2MD can use the channel, and therefore, the second memory device 2MD may output first data sensed in the second memory device 2MD to the memory controller 1DO. The memory controller may generate first LLR (1LLR), based on a first bin label (1BINL) with respect to the first data received from the second memory device 2MD, and perform error correction decoding on the first data, using the first LLR (1LLR). When the error correction decoding on the first data of the second memory device 2MD fails, the memory controller may transmit the first bin label (1BINL) to the second memory device 2MD, and the second memory device (2MD) may temporarily store the first bin label (1BINL) in idle latches of page buffers (1ST). The memory controller may transmit the first LLR (1LLR) together with the first bin label (1BINL) to the second memory device 2MD. Subsequently, the second memory device 2MD may perform a second sensing operation (2 sensing) by changing a read voltage.

When the second sensing operation (2 sensing) is ended in the first memory device 1MD while the second sensing operation (2 sensing) is being performed in the second memory device 2MD, the first memory device 1MD may re-transmit the first bin label (1BINL) temporarily stored in the first memory device 1MD to the memory controller 1RE, and output second data sensed in the first memory device 1MD to the memory controller (2DO).

The memory controller may generate a second LLR (2LLR), based on a second bin label (2BINL) with respect to the second data received from the first memory device 1MD, and perform error correction decoding on the second data, using the second LLR (2LLR). When the error correction decoding on the second data of the first memory device 1MD fails, the memory controller may transmit the second bin label (2BINL) to the first memory device 1MD, and the first memory device 1MD may temporarily store the second bin label (2BINL) in idle latches of the page buffers (2ST). The memory controller may transmit the second LLR (2LLR) together with the second bin label (2BINL) to the first memory device 1MD. Subsequently, the first memory device 1MD may perform a third sensing operation (3 sensing) by changing a read voltage.

When the second sensing operation (2 sensing) of the second memory device 2MD is ended, and the third sensing operation (3 sensing) is performed in the first memory device 1MD (T2), the second memory device 2MD may re-transmit a second bin label (2BINL) temporarily stored in the second memory device 2MD to the memory controller 1RE. When the third sensing operation (3 sensing) of the first memory device 1MD is not started even though the second sensing operation (2 sensing) of the second memory device 2MD is ended, the second memory device 2MD may stand by until the third sensing operation (3 sensing) of the first memory device 1MD is started.

When the third sensing operation (3 sensing) of the first memory device 1MD is performed (T2), the second memory device 2MD may re-transmit the first bin label (1BINL) temporarily stored in the second memory device 2MD to the memory controller 1RE, and output second data sensed in the second memory device 2MD to the memory controller 2DO.

The memory controller may generate a second LLR (2LLR), based on a second bin label (2BINL) with respect to the second data received from the second memory device 2MD, and perform error correction decoding on the second data, using the second LLR (2LLR). When the error correction decoding on the second data of the second memory device 2MD fails, the memory controller may transmit the second bin label (2BINL) to the second memory device 2MD, and the second memory device 2MD may temporarily store the second bin label (2BINL) in idle latches of the page buffers (2ST). Subsequently, the second memory device 2MD may perform a third sensing operation (3 sensing) by changing a read voltage.

When a read operation of a plurality of memory devices is performed in the above-described manner, bin labels with respect to all such memory devices are not stored in the buffer memory, so the read operation of the plurality of memory devices can be repeated plural times without increasing the capacity of the buffer memory. Further, a sensing operation, a data output operation, a bin label and LLR generating operation, and an error correction decoding operation of different memory devices can be performed in parallel, and thus the time required to perform the read operation can be reduced.

FIGS. 7 to 15 are diagrams illustrating steps performed in the read operation according to an embodiment of the present disclosure.

A case where a read operation of two memory devices are simultaneously performed is described below as an example, but it will be understood that read operations of more than two memory devices may be simultaneously performed.

Figure 7:
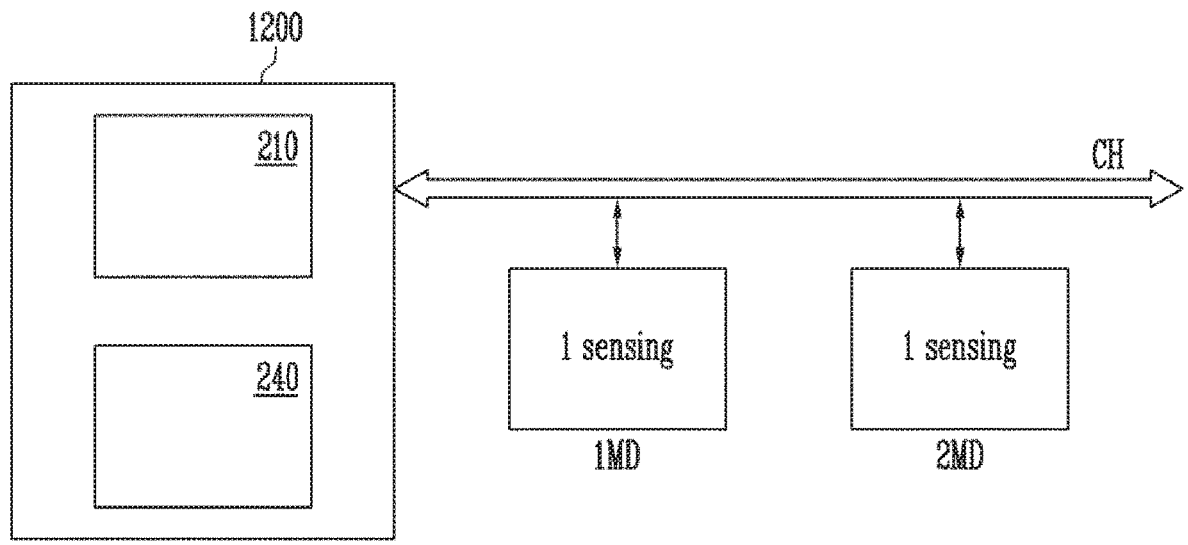
FIGS. 7 to 15 are diagrams illustrating steps performed in a read operation according to embodiments of the present disclosure.

Referring to FIG. 7, first and second memory devices 1MD and 2MD may be commonly coupled to one channel CH. Memory blocks included in the first and second memory devices 1MD and 2MD may operate in units of super blocks.

The memory controller 1200 including the ECC 210 and the buffer memory 240 may transmit a read command and an address to each of the first and second memory devices 1MD and 2MD.

The first and second memory devices 1MD and 2MD may start a read operation in response to the read command and the address. When the read operation is started, the first and second memory devices 1MD and 2MD may perform a first sensing operation (1 sensing) on a selected page. For example, the first and second memory devices 1MD and 2MD may sense data of memory cells in the selected page, using a first read voltage. The first sensing operation (1 sensing) first performed in the read operation may be simultaneously performed in the first and second memory devices 1MD and 2MD.

Figure 8:
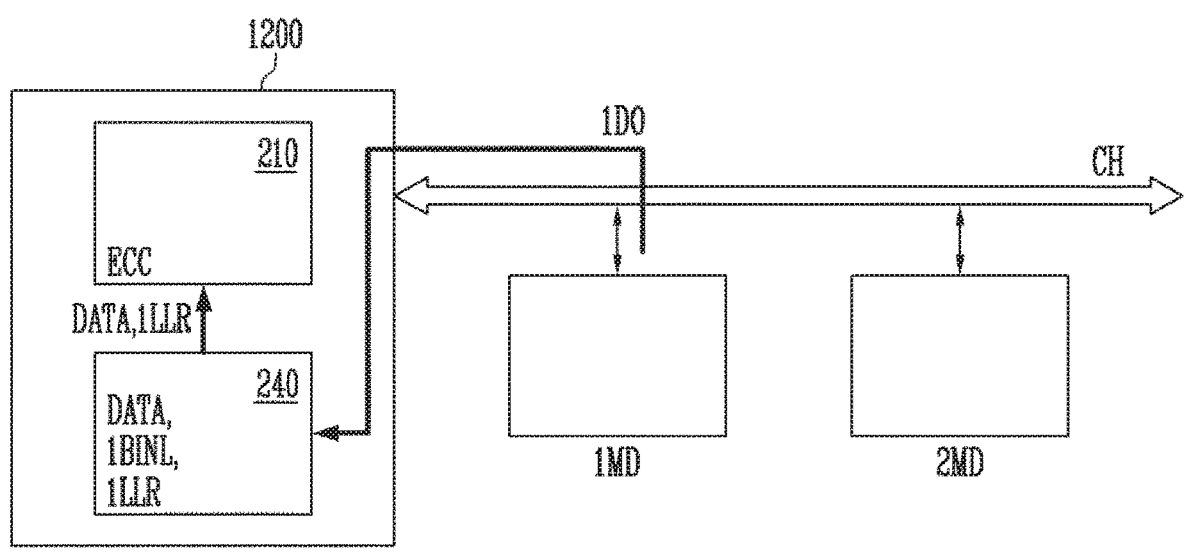

Referring to FIG. 8, the first memory device 1MD may output sensed data DATA to the buffer memory 240 through the channel CH (1DO). Since the second memory device 2MD cannot use the channel, the second memory device 2MD does not output sensed data. After the data DATA sensed in the first memory device 1MD is transmitted to the buffer memory 240, the data sensed in the second memory device 2MD may be transmitted to the buffer memory 240, but the amount of data stored therein would be increased by that of the sensed data. However, there is a limit as to how much the capacity of the buffer memory 240 in an electronic device having a small size, such as a mobile phone, may be increased. Therefore, in this embodiment, the data DATA output from the first memory device 1MD may be stored in the buffer memory 240, and the data of the second memory device 2MD may be transmitted to the buffer memory 240 after error correction decoding of the first memory device 1MD is completed.

When the data DATA of the first memory device 1MD is transmitted to the buffer memory 240, the memory controller 1200 may temporarily store, in the buffer memory 240, a first bin label (1BINL) with respect to the data DATA of the first memory device 1MD and a first LLR (1LLR) selected based on the first bin label (1BINL). Subsequently, the ECC 210 may receive the data DATA and the first LLR (1LLR) from the buffer memory 240, and perform an error correction decoding operation on the data DATA, using the first LLR (1LLR).

Figure 9:
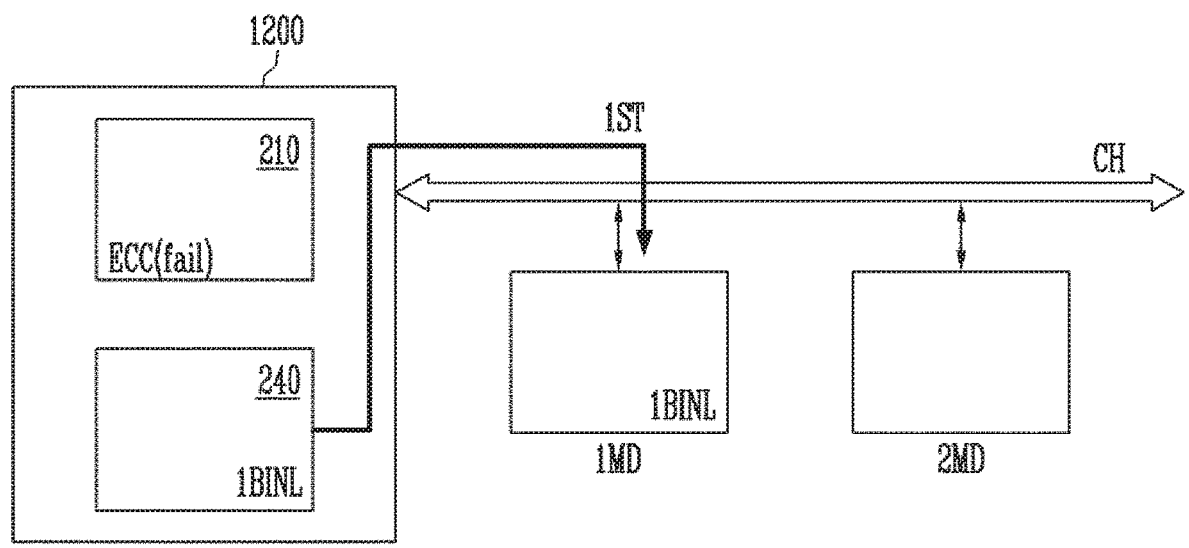

Referring to FIG. 9, when a result of the error correction decoding operation on the data DATA of the first memory device 1MD is determined as Fail, the memory controller 1200 may transmit the first bin label (1BINL) temporarily stored in the buffer memory 240 to the first memory device 1MD. Accordingly, the first memory device 1MD temporarily stores the first bin label (1BINL) in idle latches included in each page buff (1ST). A method of storing a bin label in idle latches in the page buffer has been described in FIG. 4, and therefore, detailed description thereof is omitted here. The first bin label (1BINL) is accumulated until a read operation on the selected page of the first memory device 1MD passes. Therefore, the first bin label (1BINL) may be temporarily stored in the first memory device 1MD.

When the first bin label (1BINL) is stored in the first memory device 1MD, the buffer memory 240 may be initialized so as to perform a next operation.

Figure 10:
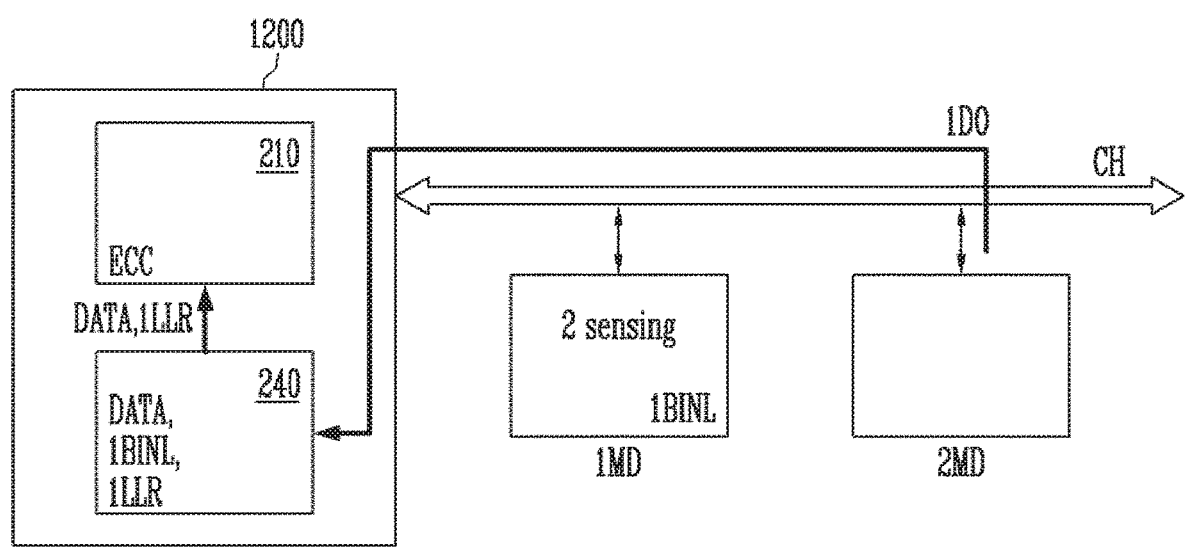

Referring to FIG. 10, the first memory device 1MD may perform a second sensing operation (2 sensing) of re-sensing data of the memory cells included in the selected page, using a second read voltage. For example, the first memory device 1MD may perform the second sensing operation (2 sensing), using the second read voltage different from the first read voltage.

While the second sensing operation (2 sensing) is being performed in the first memory device 1MD, the second memory device 2MD may output data DATA sensed in the first sensing operation (1 sensing) of FIG. 7 to the buffer memory 240 through the channel CH (1DO).

When the data DATA of the second memory device 2MD is transmitted to the buffer memory 240, the memory controller 1200 may generate a first bin label (1BINL) with respect to the data DATA of the second memory device 2MD and a first LLR (1LLR) selected based on the first bin label (1BINL) and temporarily store the first bin label (1BINL) and the first LLR (1LLR) in the buffer memory 240. Subsequently, the ECC 210 may receive the data DATA and the first LLR (1LLR) from the buffer memory 240, and perform error correction decoding on the data DATA, using the first LLR (1LLR).

Figure 11:
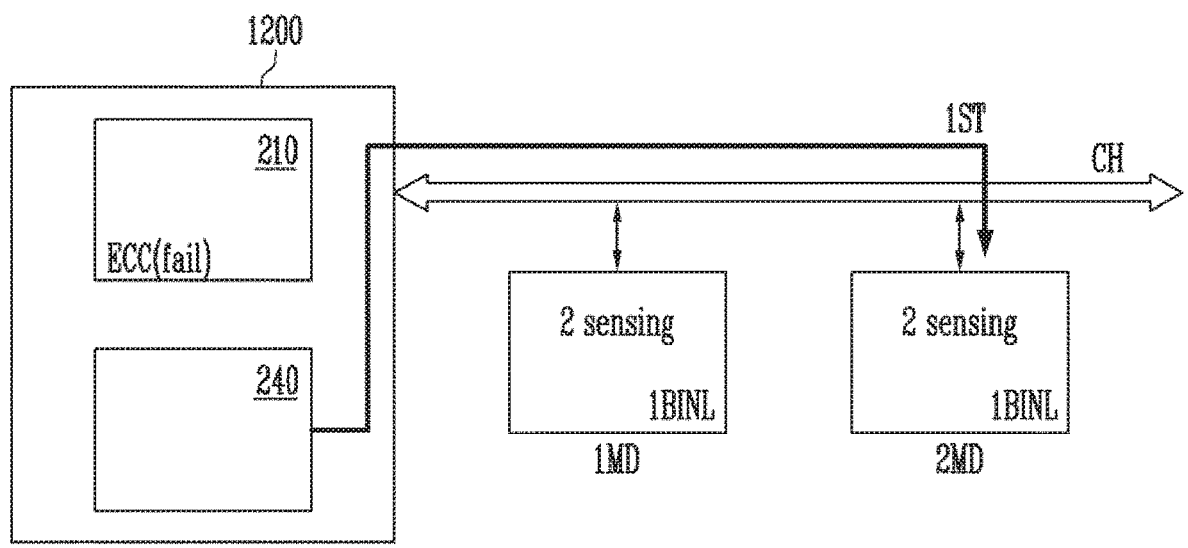

Referring to FIG. 11, when a result of the error correction decoding on the data DATA of the second memory device 2MD is determined as Fail, the memory controller 1200 may transmit the first bin label (1BINL) temporarily stored in the buffer memory 240 to the second memory device 2MD. Accordingly, the second memory device 2MD may temporarily store the first bin label (1BINL) in idle latches included in each page buffer (1ST). The first bin label (1BINL) is used when a next LLR of the second memory device 2MD is searched. Therefore, the first bin label (1BINL) may be temporarily stored in the second memory device 2MD.

When the first bin label (1BINL) is stored in the second memory device 2MD, the buffer memory 240 may be initialized so as to perform a next operation.

Subsequently, the second memory device 2MD may perform a second sensing operation (2 sensing) of re-sensing data of the memory cells included in the selected page, using the second read voltage. That is, while the second sensing operation (2 sensing) is performed in the first memory device 1MD, the second sensing operation (2 sensing) may also be performed in the second memory device 2MD for a certain time.

Figure 12:
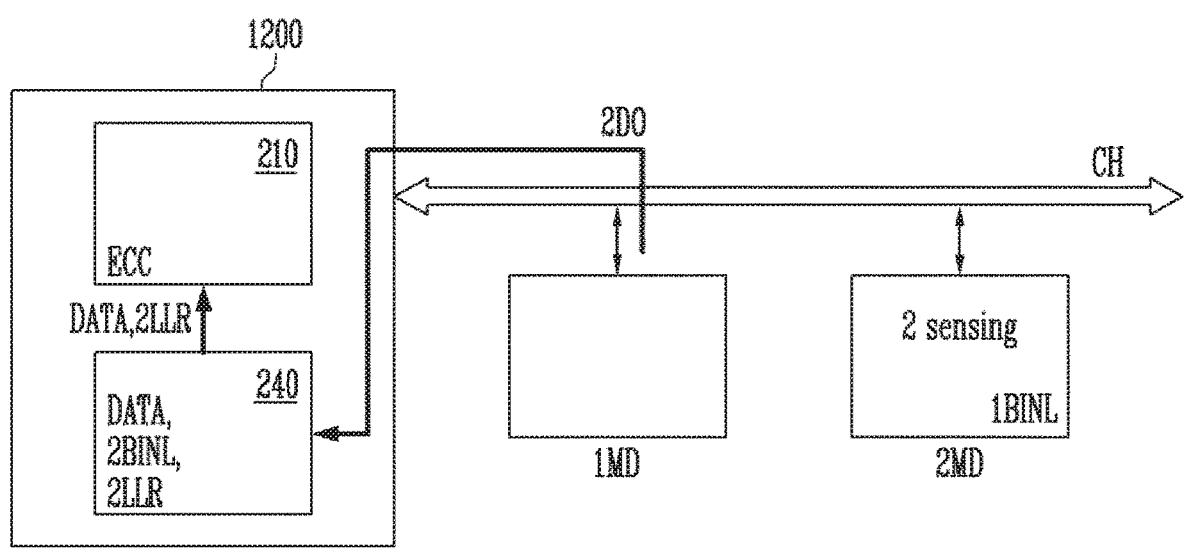

Referring to FIG. 12, although the second sensing operation (2 sensing) is simultaneously performed in the first and second memory devices 1MD and 2MD, the second sensing operation (2 sensing) has been first performed in the first memory device 1MD. Therefore, the second sensing operation (2 sensing) may be ended earlier than the second memory device 2MD.

When the second sensing operation (2 sensing) of the first memory device 1MD is ended, the first memory device 1MD may output the temporarily stored first bin label (1BINL) and the data DATA sensed in the second sensing operation (2 sensing) of FIG. 11 to the buffer memory 240 through the channel CH while the second sensing operation (2 sensing) is being performed (2DO).

When the data DATA of the first memory device 1MD and the first bin label (1BINL) are transmitted to the buffer memory 240, the memory controller 1200 may generate a second bin label (2BINL) from the data DATA of the first memory device 1MD and the first bin label (1BINL), generate a second LLR (2LLR), based on the second bin label (2BINL), and temporarily store the second bin label (2BINL) and the second LLR (2LLR) in the buffer memory 240. Subsequently, the ECC 210 may receive the data DATA and the second LLR (2LLR) from the buffer memory 240, and perform error correction decoding on the data DATA, using the second LLR (2LLR).

Figure 13:
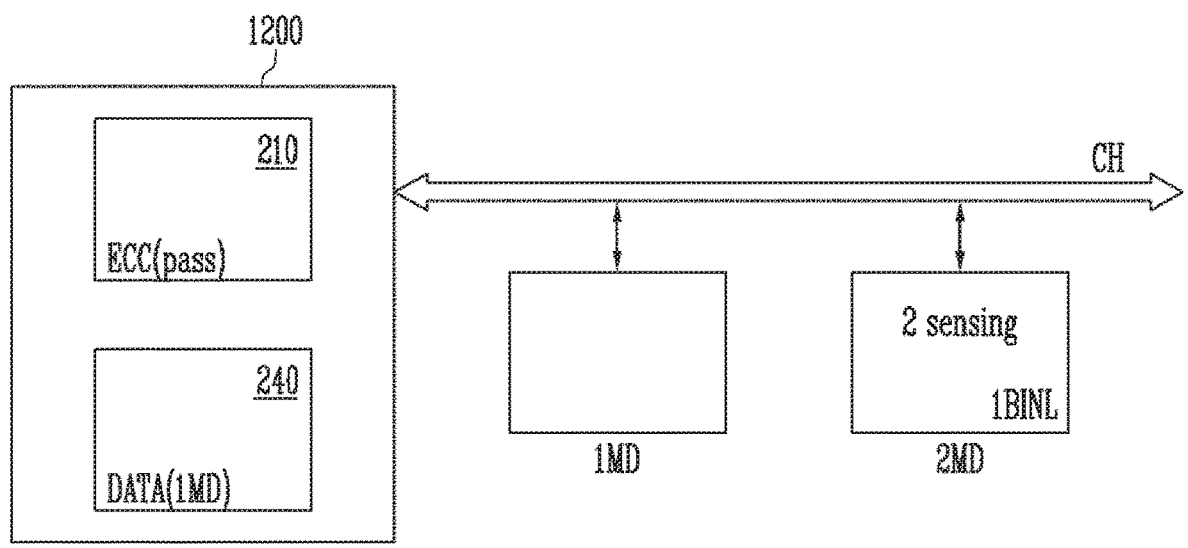

Referring to FIG. 13, when a result of the error correction decoding on the data DATA of the first memory device 1MD is determined as Pass, the memory controller 1200 may store final data DATA of the first memory device 1MD in the buffer memory 240, and transmit a command for completing the read operation to the first memory device 1MD.

Figure 14:
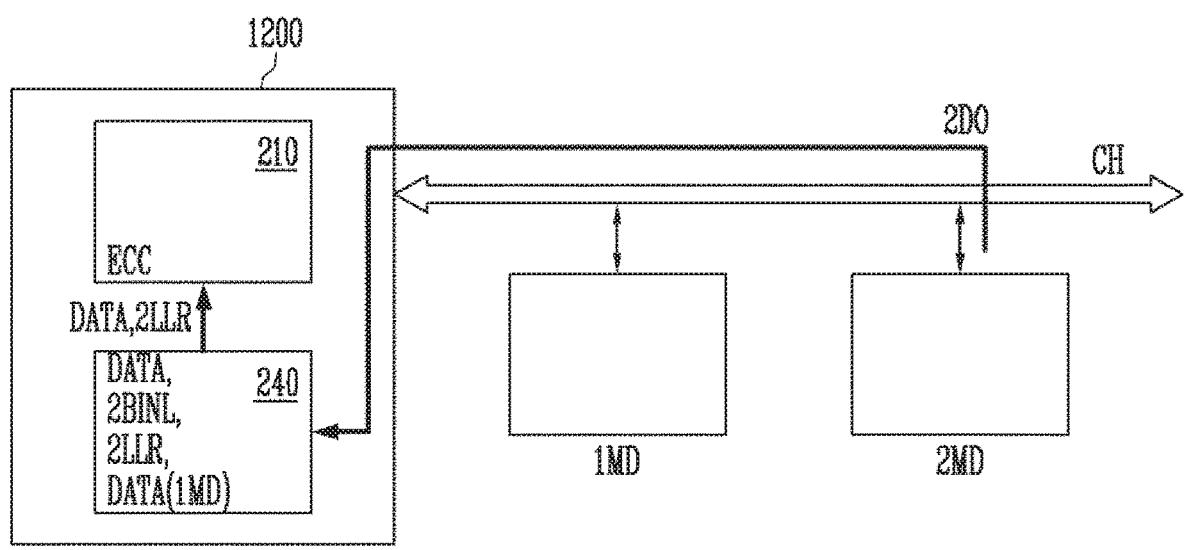

Referring to FIG. 14, when the second sensing operation (2 sensing) of the second memory device 2MD is ended, the second memory device 2MD may output the temporarily stored first bin label (1BINL) and the data DATA sensed in the second sensing operation (2 sensing) of FIG. 13 to the buffer memory 240 through the channel CH (2DO).

When the data DATA of the second memory device 2MD and the first bin label (1BINL) are transmitted to the buffer memory 240, the memory controller 1200 may generate a second bin label (2BINL) from the data DATA of the second memory device 2MD and the first bin label (1BINL), generate a second LLR (2LLR), based on the second bin label (2BINL), and temporarily store the second bin label (2BINL) and the second LLR (2LLR) in the buffer memory 240. Subsequently, the ECC 210 may receive the data DATA and the second LLR (2LLR) from the buffer memory 240, and perform error correction decoding on the data DATA, using the second LLR (2LLR).

Figure 15:
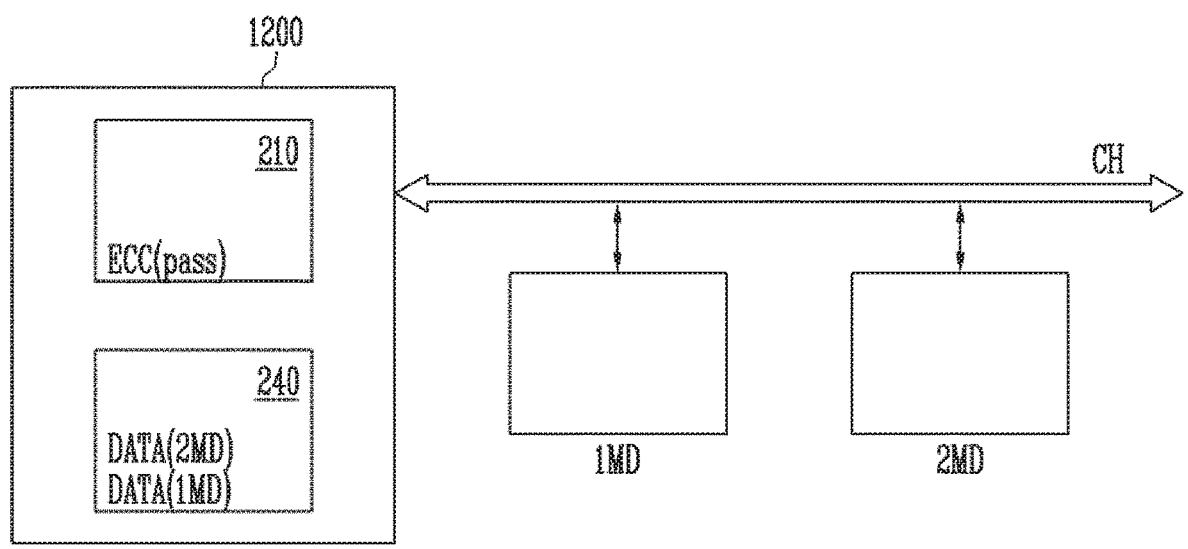

Referring to FIG. 15, when a result of the error correction decoding on the data DATA of the second memory device 2MD is determined as Pass, the memory controller 1200 may store final data DATA of the second memory device 2MD in the buffer memory 240, and transmit a command for completing the read operation to the second memory device 2MD.

Accordingly, data read from the first and second memory devices 1MD and 2MD are temporarily stored in the buffer memory 240, and the temporarily stored data are output to the host.

Figure 16:
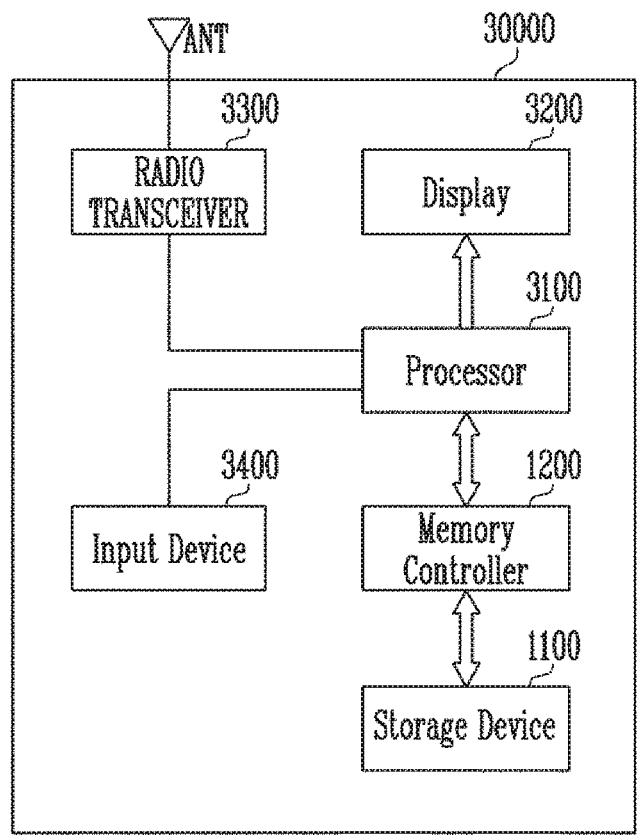
FIG. 16 is a diagram illustrating another embodiment of the memory system including a memory controller shown in FIG. 1.

FIG. 16 is a diagram illustrating another embodiment of the memory system including the memory controller shown in FIG. 1.

Referring to FIG. 16, the memory system 30000 may be implemented as a cellular phone, a smart phone, a tablet PC, a personal digital assistant (PDA), or a wireless communication device. The memory system 30000 may include a storage device 1100 and a memory controller 1200 capable of controlling an operation of the storage device 1100. The memory controller 1200 may control a data access operation of the storage device 1100, e.g., a program operation, an erase operation, a read operation, or the like under the control of a processor 3100.

Data programmed in the storage device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor storage device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the storage device 1100 may be implemented as a part of the processor 3100, or be implemented as a chip separate from the processor 3100.

Figure 17:
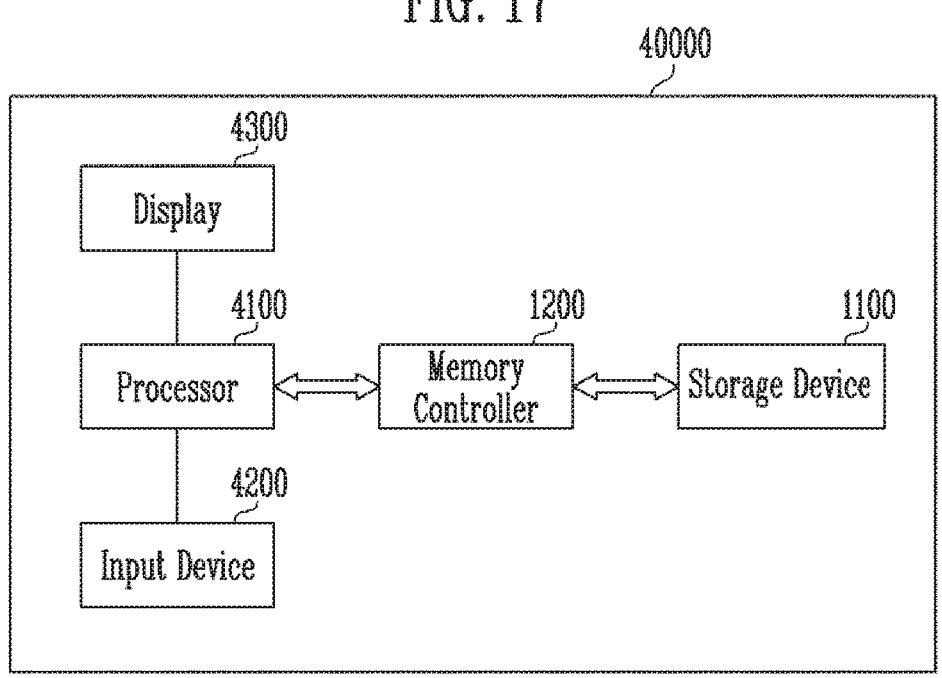
FIG. 17 is a diagram illustrating another embodiment of the memory system including the memory controller shown in FIG. 1.

FIG. 17 is a diagram illustrating another embodiment of the memory system including the memory controller shown in FIG. 1.

Referring to FIG. 17, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage device 1100 and a memory controller 1200 capable of controlling a data processing operation of the storage device 1100.

A processor 4100 may output data stored in the storage device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the storage device 1100 may be implemented as a part of the processor 4100, or be implemented as a chip separate from the processor 4100.

Figure 18:
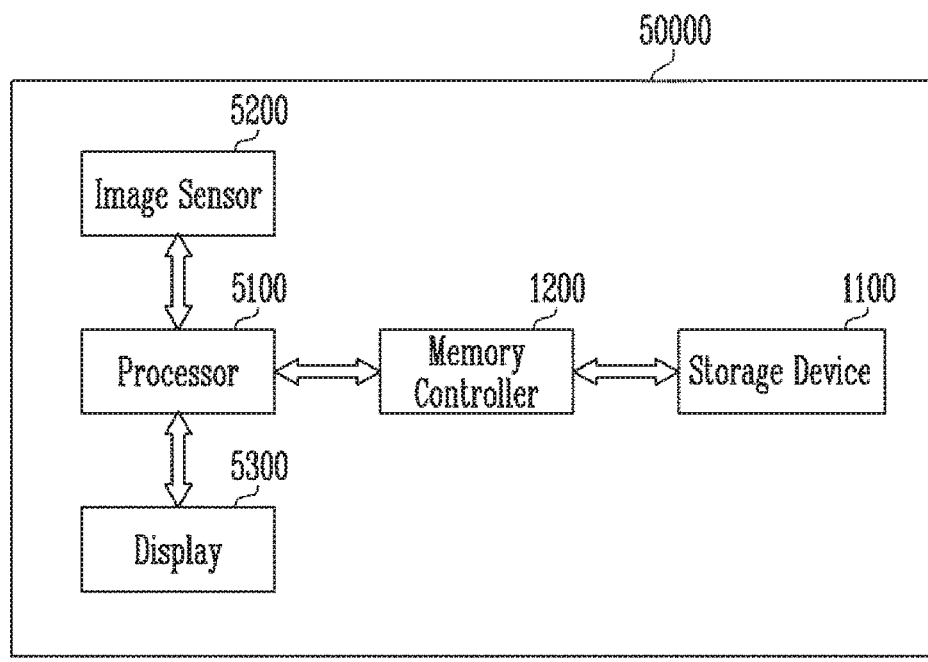
FIG. 18 is a diagram illustrating another embodiment of the memory system including the memory controller shown in FIG. 1.

FIG. 18 is a diagram illustrating another embodiment of the memory system including the memory controller shown in FIG. 1.

Referring to FIG. 18, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a storage device 1100 and a memory controller 1200 capable of controlling a data processing operation of the storage device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the storage device 1100 through the memory controller 1200. In addition, data stored in the storage device 1100 may be output through the display 5300 under the control of the processor 5100 or the memory controller 1200.

In some embodiments, the memory controller 1200 capable of controlling an operation of the storage device 1100 may be implemented as a part of the processor 5100, or be implemented as a chip separate from the processor 5100.

Figure 19:
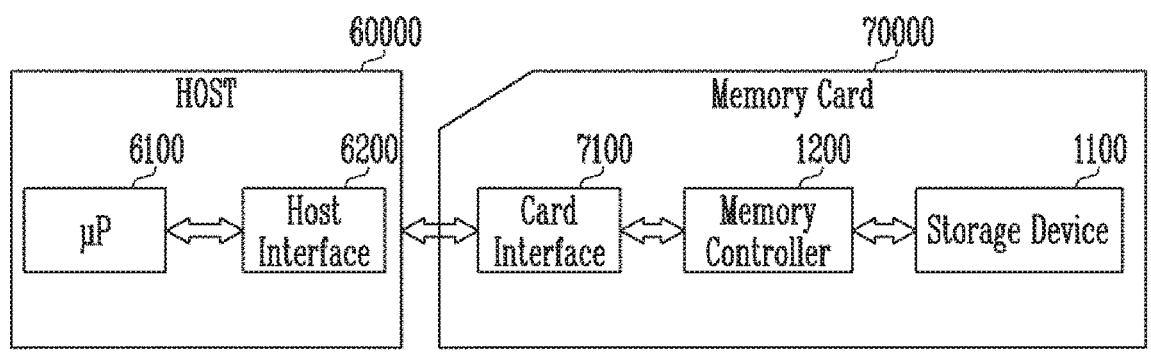
FIG. 19 is a diagram illustrating another embodiment of the memory system including the memory controller shown in FIG. 1.

FIG. 19 is a diagram illustrating another embodiment of the memory system including the memory controller shown in FIG. 1.

Referring to FIG. 19, the memory system 70000 may be implemented as a memory card or a smart card. The memory system 70000 may include a storage device 1100, a memory controller 1200, and a card interface 7100.

The memory controller 1200 may control data exchange between the storage device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage device 1100 through the card interface 7100 and the memory controller 1200 under the control of a microprocessor (µP) 6100.

According to embodiments of the present disclosure, in a memory system including a plurality of memory devices, the memory controller can rapidly perform error correction decoding on the plurality of memory devices. Accordingly, the read operation speed of the memory system can be improved.

Various embodiments have been disclosed herein, and although specific terms are employed, they are used and are to be interpreted in a generic and descriptive sense and not for purpose of limitation. In some instances, as would be apparent to those skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
a processor configured to generate a command and an address in response to a request from a host, and generate a first bin label and a first Log Likelihood Ratio (LLR) of a first memory device based on first data received from a first memory device or generate a second bin label and a second LLR of a second memory device based on second data received from a second memory device;
a buffer memory configured to temporarily store the first data, the first bin label, and the first LLR when error correction decoding on the first data read from the first memory device, or temporarily store the second data, the second bin label, and the second LLR when error correction decoding on the second data read from the second memory device; and
an error correction circuit configured to perform the error correction decoding on the first data using the first LLR or the second data using the second LLR,
wherein the processor:
when a result of the error correction decoding on the first data read from the first memory device is determined to have failed, transmits the first bin label to the first memory device to temporarily store the first bin label into at least one page buffer included in the first memory device, initializes the buffer memory, and then performs error correction decoding for the second memory device;
when a result of the error correction decoding on the second data read from the second memory device is determined to have failed, transmits the second bin label to the second memory device to temporarily store the second bin label into at least one page buffer included in the second memory device;
receives the first bin label temporarily stored in the first memory device to perform error correction decoding on data read from the first memory device using a read voltage; and
receives the second bin label temporarily stored in the second memory device to perform error correction decoding on data read from the second memory device using a read voltage.

2. The memory controller of claim 1, wherein the processor includes:
a command generator configured to generate the command;
a bin label generator configured to generate the first or second bin label based on the first or second data received from the first or second memory device; and
an LLR generator configured to generate the first or second LLR based on the first or second bin label.

3. The memory controller of claim 2, wherein the bin label generator generates, as the first or second bin label, a value obtained from all code words of the first or second data received from the first or second memory device.

4. The memory controller of claim 1, wherein the buffer memory includes:
a data storage configured to temporarily store the first or second data received from the first or second memory device;
a bin label storage configured to temporarily store the first or second bin label; and
an LLR storage configured to temporarily store the first or second LLR.

5. The memory controller of claim 1, wherein, when the first bin label of the first memory device is temporarily stored in the at least one page buffer of the first memory device, the buffer memory in which the first bin label is stored is initialized.

6. The memory controller of claim 1, wherein the error correction circuit:
when it is determined that an error of the first or second data received from the first or second memory device cannot be corrected, the result of the error correction decoding is output as fail; and
when it is determined that an error of the first or second data received from the first or second memory device can be corrected, the result of the error correction decoding is output as pass.

7. The memory controller of claim 1,
wherein the first bin label is deleted when the result of the error correction decoding on the first data read from the first memory device is determined as pass, and
wherein the second bin label is deleted when the result of the error correction decoding on the second data read from the second memory device is determined as pass.

8. The memory controller of claim 1, wherein, when a sensing operation is performed in the first memory device, the processor receives the second data from the second memory device and controls the error correction circuit to perform error correction decoding on the second data received from the second memory device.

9. A memory system comprising:
a first memory device configured to store first data and a second memory device configured to store second data; and
a memory controller configured to control a read operation of each of the first and second memory devices,
wherein the memory controller:
generates a first bin label and a first LLR based on the first data received from the first memory device;
performs error correction decoding on the first data using the first LLR;
when the error correction decoding fails, transmits the first bin label to the first memory device, and initializes a buffer memory in which the first bin label and the first LLR are stored; and
receives the second data from the second memory device, and performs the error correction decoding on the second data.

10. The memory system of claim 9, wherein each of the first and second memory devices includes:
memory cells configured to store data; and
page buffers configured to sense data of the memory cells through bit lines.

11. The memory system of claim 10, wherein each of the page buffers includes:
a first latch configured to temporarily store data read from the memory cells; and
a second latch configured to temporarily store the first bin label.

12. The memory system of claim 11, wherein the first bin label temporarily stored in the second latch is again output to the memory controller in response to a request from the memory controller.

13. The memory system of claim 9, wherein the memory controller includes:
a processor configured to control the first or second memory device in response to a request from a host, and generate the first bin label and the first LLR based on the first data;
the buffer memory configured to temporarily store the first data, the first bin label, and the first LLR; and
an error correction circuit configured to perform the error correction decoding on the first data based on the first LLR.

14. The memory system of claim 13, wherein the processor includes:
a command generator configured to generate a command for controlling the first memory device in response to the request from the host;
a bin label generator configured to generate the first bin label based on the first data read from the first memory device; and
an LLR generator configured to generate the first LLR based on the first data read from the first memory device.

15. The memory system of claim 14, wherein the bin label generator generates, as the first bin label, a value obtained from all code words of the first data.

16. The memory system of claim 13, wherein the buffer memory includes:
a data storage configured to temporarily store the first or second data;
a bin label storage configured to temporarily store the first bin label; and
an LLR storage configured to temporarily store the first LLR.

17. The memory system of claim 13, wherein, when the first bin label of the first memory device is temporarily stored in the first memory device, the first bin label temporarily stored in the buffer memory is deleted.

18. The memory system of claim 13, wherein the processor ends the read operation of the first memory device when the error correction decoding has passed.

19. A memory system comprising:
memory devices, each including memory cells and page buffers; and
a controller performing an error-correction operation of a selected memory device among the memory devices,
the controller configured to:
include a buffer memory storing a bin label corresponding to the selected memory device;
control the selected memory device to repeat a read operation using different read voltages, until the error-correction operation is successful;
generate the bin label based on data read from the selected memory device, and store the bin label into the buffer memory;
repeat the error-correction operation of the data until the error-correction operation is successful;
control the selected memory device to update the bin label in the page buffers when the error-correction operation fails; and initialize the buffer memory in which the bin label corresponding to an unselected memory device is stored before the error-correction operation of the selected memory device is performed,
wherein the memory devices share a channel and alternately communicate with the controller through the channel.

* * * * *